(12) United States Patent
Morooka et al.

(10) Patent No.: US 8,373,058 B2
(45) Date of Patent: Feb. 12, 2013

(54) SOLAR CELL AND METHOD OF ADJUSTING COLOR OF THE SAME

(75) Inventors: Hisao Morooka, Tokyo (JP); Takeshi Echizenya, Tokyo (JP); Hirokazu Fujioka, Tokyo (JP); Saki Takahashi, Tokyo (JP); Kazuo Nishi, Atsugi (JP)

(73) Assignees: TDK Corporation, Tokyo (JP); Semiconductor Energy Laboratory Co., Ltd., Atsugi-Shi (JP)

( * ) Notice: Subject to any disclaimer, the term of this patent is extended or adjusted under 35 U.S.C. 154(b) by 1574 days.

(21) Appl. No.: 11/362,913

(22) Filed: Feb. 28, 2006

(65) Prior Publication Data

US 2006/0219293 A1    Oct. 5, 2006

(30) Foreign Application Priority Data

Mar. 30, 2005   (JP) ................. 2005-098071

(51) Int. Cl.
*H01L 25/00* (2006.01)
(52) U.S. Cl. ......... 136/243; 136/258; 136/260; 438/933
(58) Field of Classification Search .............. 136/243, 136/258, 260; 438/933
See application file for complete search history.

(56) References Cited

U.S. PATENT DOCUMENTS

| | | | | |
|---|---|---|---|---|
| 4,551,575 A | * | 11/1985 | Takahashi et al. | 136/255 |
| 4,941,032 A | * | 7/1990 | Kobayashi et al. | 257/53 |
| 5,891,264 A | * | 4/1999 | Shinohara et al. | 136/261 |
| 6,023,020 A | | 2/2000 | Nishitani et al. | |
| 2005/0205127 A1 | * | 9/2005 | Watanabe et al. | 136/255 |

FOREIGN PATENT DOCUMENTS

| | | |
|---|---|---|
| CN | 1185662 A | 6/1998 |
| JP | U-1-139458 | 9/1989 |
| JP | B2 2-6235 | 2/1990 |
| JP | A-5-251723 | 9/1993 |

* cited by examiner

*Primary Examiner* — Xiuyu Tai
(74) *Attorney, Agent, or Firm* — Oliff & Berridge, PLC (57) ABSTRACT

The present invention provides a solar cell whose external color can be adjusted so that redness is suppressed. In the case where a photoelectric conversion layer contains amorphous silicon, an optical absorption layer is provided between the photoelectric conversion layer and a reflecting electrode layer. The optical absorption layer has a light absorbing property mainly in a long wavelength range, while the photoelectric conversion layer (amorphous silicon) has a selective light absorbing property mainly in a short/medium wavelength range. Incident light (solar light) passed through the photoelectric conversion layer further passes through the optical absorption layer and, after that, is reflected by the reflecting electrode layer. That is, remaining light of the incident light absorbed by the optical absorption layer and the photoelectric conversion layer is reflected by the reflecting electrode layer. Consequently, redness of the reflection light can be suppressed more than in the case where the optical absorption layer is not provided between the photoelectric conversion layer and the reflecting electrode layer.

2 Claims, 5 Drawing Sheets

FIG. 9

SOLAR CELL AND METHOD OF ADJUSTING COLOR OF THE SAME

BACKGROUND OF THE INVENTION

1. Field of the Invention

The present invention relates to a solar cell that converts light energy into electrical energy and a solar cell color adjusting method of adjusting the external color of the solar cell.

2. Description of the Related Art

In recent years, real spread of photovoltaic power generation is expected from the viewpoint of global environmental conservation, so that solar cells are actively developed. The solar cell is a battery device that converts light energy of sunlight into electrical energy (so-called photoelectric conversion).

The solar cell has a stacking structure obtained by stacking mainly, on a substrate, a reflecting electrode layer, a photoelectric conversion layer (so-called power generation layer), and a transparent electrode layer in this order. In a solar cell of this kind, incident light (sunlight) led to the inside the solar cell via the transparent electrode layer is reflected by the reflecting electrode layer. When the reflection light is led to the outside of the solar cell via the transparent electrode layer again, power is generated in the photoelectric conversion layer.

With respect to the configuration of the solar cell, some modes have been already proposed. Concretely, a technique is known in which when the photoelectric conversion layer is made of amorphous silicon, by constructing the reflecting electrode layer so as to have a stacking structure in which a layer of metal or alloy (first metal layer), and a layer of metal, alloy, stainless steel, or silicon steel alloy (second metal layer) are stacked in order, adhesion between the photoelectric conversion layer and the reflecting electrode layer is enhanced and mutual diffusion between them is prevented (refer to, for example, Japanese Patent Publication No. Hei 02-006235).

In recent years, a solar cell for low-illumination-level use mounted on, for example, a watch or the like is in increase demand not only from the viewpoint of battery properties such as power generation performance but also from the viewpoint of design-conscious external appearance. Concretely, in a solar cell whose photoelectric conversion layer is made of amorphous silicon, external color takes on redness due to the light absorbing property of amorphous silicon. To make the solar cell inconspicuous in the external appearance of the watch, it is necessary to adjust the external color so that the redness is suppressed.

However, a conventional solar cell has a problem such that, since concrete countermeasures are not taken from the viewpoint of adjusting the external color, it is difficult to adjust the external color in accordance with a demand for color tones.

SUMMARY OF THE INVENTION

The present invention has been achieved in consideration of such a problem and its object is to provide a solar cell whose external color can be adjusted so as to suppress redness, and a method of adjusting color of the solar cell.

A solar cell according to the present invention includes: a first electrode layer having a light transmitting property; a second electrode layer having a light reflecting property; a photoelectric conversion layer provided between the first and second electrode layers, containing amorphous silicon, and converting light energy into electrical energy; and an optical absorption layer provided between the photoelectric conversion layer and the second electrode layer and having electrical conductivity and a light absorbing property.

A solar cell color adjusting method according to the present invention adjusts an external color of a solar cell including a first electrode layer having a light transmitting property, a second electrode layer having a light reflecting property, and a photoelectric conversion layer provided between the first and second electrode layers, containing amorphous silicon, and converting light energy into electrical energy, and an optical absorption layer having electrical conductivity and a light absorbing property is provided between the photoelectric conversion layer and the second electrode layer so that light passed through the photoelectric conversion layer is absorbed by the optical absorption layer.

In the solar cell according to the invention and the method of adjusting the color of the same, in the case where the photoelectric conversion layer contains amorphous silicon, an optical absorption layer is provided between the photoelectric conversion layer and the second electrode layer. The optical absorption layer has a light absorbing property mainly in a long wavelength range while the photoelectric conversion layer (amorphous silicon) has a selective light absorbing property mainly in a short/medium wavelength range. In this case, incident light (solar light) passed through the photoelectric conversion layer further passes through the optical absorption layer and, after that, is reflected by the reflecting electrode layer. That is, remaining light of the incident light absorbed by the optical absorption layer and the photoelectric conversion layer is reflected by the reflecting electrode layer. Consequently, redness of the reflection light can be suppressed more than in the case where the optical absorption layer is not provided.

In the solar cell according to the invention, preferably, a product $\alpha T$ between an absorption coefficient $\alpha$ and a thickness T of the optical absorption layer is in a range of 0.2 to 3.0. In this case, the optical absorption layer may contain any metal selected from a group consisting of nickel (Ni), aluminium (Al), copper (Cu), gold, (Au), manganese (Mn), niobium (Nb), palladium (Pd), platinum (Pt), silver (Ag) and zinc (Zn), or any silicide selected from a group consisting of chromium silicide (CrSi or $CrSi_2$), cobalt silicide (CoSi, $Co_2Si$, or $CoSi_2$), iron silicide (FeSi or $FeSi_2$), manganese silicide (MnSi), molybdenum silicide ($Mo_2Si$), niobium silicide ($NbSi_2$), palladium silicide ($Pd_2Si$), platinum silicide (PtSi or $Pt_2Si$), tantalum silicide ($TaSi_2$), titanium silicide (TiSi or $TiSi_2$), tungsten silicide ($WSi_2$) or nickel silicide (NiSi, $Ni_2Si$ or $NiSi_2$).

In the solar cell and the method of adjusting the color of the same according to the invention, in the case where the photoelectric conversion layer contains amorphous silicon, an optical absorption layer is provided between the photoelectric conversion layer and the second electrode layer, so that redness of light (reflection light) passed through the photoelectric conversion layer and reflected by the reflecting electrode layer is suppressed. Therefore, the color tone of the external color of the solar cell determined on the basis of the color tone of the reflection light can be suppressed, so that the external color can be adjusted so as to suppress redness.

Other and further objects, features and advantages of the invention will appear more fully from the following description.

DETAILED DESCRIPTION OF THE PRFERRED EMBODIMENTS

Embodiments of the invention will now be described in detail hereinbelow with reference to the drawings.

Figure 1:
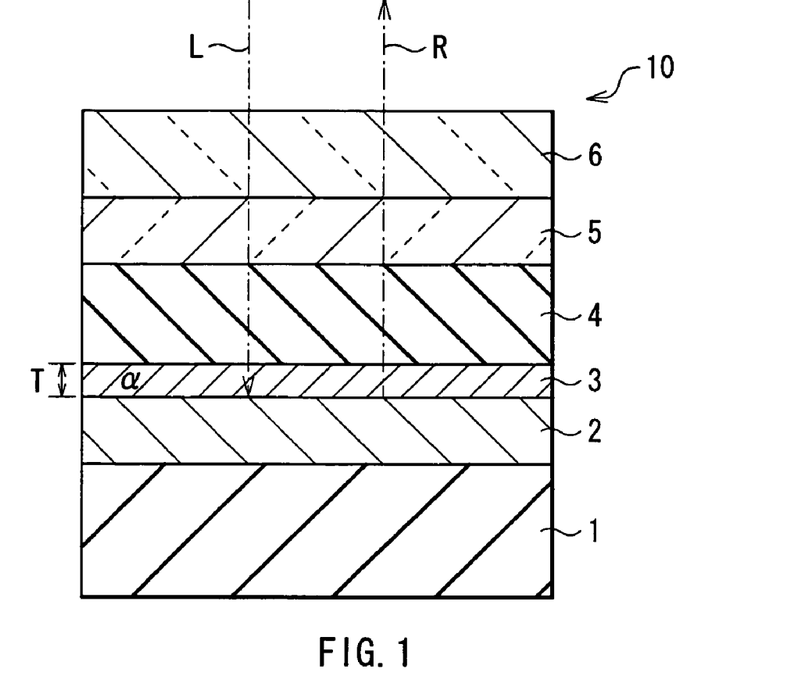
FIG. 1 is a cross section showing a sectional configuration of a solar cell according to an embodiment of the invention.

First, the configuration of a solar cell according to an embodiment of the invention will be described with reference to FIG. 1. FIG. 1 shows a sectional configuration of a solar cell 10. "A method of adjusting color of a solar cell" of the invention is realized on the basis of the configuration and action of the solar cell according to the embodiment, so that the "method of adjusting color of the solar cell" will be also described in the following.

The solar cell 10 is a battery device that converts light energy of incident light (sunlight) L into electrical energy by using a photoelectric conversion function. The solar cell 10 has, as shown in FIG. 1, a transparent electrode layer 5, a reflecting electrode layer 2, a photoelectric conversion layer 4 provided between the transparent electrode layer 5 and the reflecting electrode layer 2, and an optical absorption layer 3 provided between the photoelectric conversion layer 4 and the reflecting electrode layer 2. More concretely, the solar cell 10 has a stacking structure in which, for example, the reflecting electrode layer 2, the optical absorption layer 3, the photoelectric conversion layer 4, the transparent electrode layer 5, and a sealing material 6 are stacked in this order.

The substrate 1 supports the whole solar cell 10. The substrate 1 is a plastic film made of polyethylene naphthalate (PEN) or the like.

The reflecting electrode layer 2 is a second electrode layer used for deriving electric energy converted in the photoelectric conversion layer 4. In particular, the reflecting electrode layer 2 has the light reflecting property. Specifically, the reflecting electrode layer 2 has the function of leading the incident light L to the outside of the solar cell 10 as reflection light R by reflecting the incident light L led to the inside of the solar cell 10. The reflecting electrode layer 2 is formed by containing a light reflecting conductive material such as aluminium (Al), platinum (Pt), silver (Ag), or titanium (Ti).

The optical absorption layer 3 has electrical conductivity and optical absorbency, that is, adjusts the external color of the solar cell 10 by absorbing the incident light L. More concretely, by absorbing light passed through the photoelectric conversion layer 4, that is, remaining light in a specific wavelength range which has reached the optical absorption layer 3 after being absorbed by the photoelectric conversion layer 4 (used for power generation), the optical absorption layer 3 adjusts apparent color tone of the solar cell 10 determined on the basis of the color tone of the reflection light R.

The "light in the specific wavelength range" is light in a long-wavelength range of about 600 nm or more and is light in a color range generally classified in red.

In particular, the optical absorption layer 3 has a specific relation between an absorption coefficient α and a thickness T in order to absorb light in the specific wavelength range described above. More concretely, a product αT of the absorption coefficient α and the thickness T of the optical absorption layer 3 is, for example, in a range of 0.2 to 3.0 ($0.2 \leq \alpha T \leq 3.0$). The thickness T of the optical absorption layer 3 can be freely set in the range where the relation of the product αT is satisfied.

The optical absorption layer 3 is formed by containing any one of a group of metals including nickel (Ni), aluminium (Al), copper (Cu), gold, (Au), manganese (Mn), niobium (Nb), palladium (Pd), platinum (Pt), silver (Ag) and zinc (Zn), or any one of a group of silicides including chromium silicide ($CrSi$ or $CrSi_2$), cobalt silicide ($CoSi$, $Co_2Si$, or $CoSi_2$), iron silicide ($FeSi$ or $FeSi_2$), manganese silicide ($MnSi$), molybdenum silicide ($Mo_2Si$), niobium silicide ($NbSi_2$), palladium silicide ($Pd_2Si$), platinum silicide ($PtSi$ or $Pt_2Si$), tantalum silicide ($TaSi_2$), titanium silicide ($TiSi$ or $TiSi_2$), tungsten silicide ($WSi_2$) and nickel silicide ($NiSi$, $Ni_2Si$ or $NiSi_2$). The optical absorption layer 3 may be formed by containing, for example, stainless steel (SUS) other than the metals or silicides described above.

The photoelectric conversion layer 4 converts light energy of the incident light L into electrical energy. The photoelectric conversion layer 4 is formed by containing amorphous silicon (a-Si) and has a pin junction structure (n-layer/i-layer/p-layer). In particular, the photoelectric conversion layer 4 selectively and intensively absorbs light in the specific wavelength range in the incident light L on the basis of a selective light absorbing property of amorphous silicon, and performs energy conversion. The "light in the specific wavelength range" is light of a short and medium wavelength range less than about 600 nm and light in a color range generally classified in green and blue. The photoelectric conversion layer 4 absorbs light in the specific wavelength range (light in the short and medium wavelength range less than about 600 nm) and performs energy conversion. In addition, the photoelectric conversion layer 4 slightly absorbs light in a wavelength range other than the specific wavelength range (light in a long wavelength range which is about 600 nm or longer) and performs energy conversion.

The transparent electrode layer 5 is a first electrode layer used for deriving electrical energy converted in the photoelectric conversion layer 4. In particular, the transparent electrode layer 5 has light transmitting property. Specifically, the transparent electrode layer 5 has the function of transmitting the incident light L led to the inside of the solar cell 10 to the photoelectric conversion layer 4 and transmitting the reflection light R reflected by the reflection electrode layer 2 to the outside of the solar batter 10. The transparent electrode layer 5 is formed by containing, for example, a light-transmitting conductive material such as indium tin oxide (ITO).

The sealing material 6 protects a main part (mainly the photoelectric conversion layer 4 and the like) of the solar cell 10. The sealing material 6 contains, for example, a light-transmitting insulating material such as epoxy resin.

In the solar cell 10, as shown in FIG. 1, when the incident light L enters, the incident light L passes through the sealing material 6, the transparent electrode layer 5, the photoelectric conversion layer 4, and the optical absorption layer 3 in this order, and reaches the reflecting electrode layer 2, thereby being led to the inside the solar cell 10. After that, when the incident light L is reflected by the reflecting electrode layer 2 and becomes the reflection light R, the reflection light R sequentially passes through the optical absorption layer 3, the photoelectric conversion layer 4, the transparent layer 5, and the sealing material 6 and is led to the outside of the solar cell 10.

The incident light L is absorbed by the photoelectric conversion layer 4 in a process of being led to the inside the solar cell 10 and the reflection light R is absorbed by the photoelectric conversion layer 4 in a process of being led to the outside of the solar cell 10, so that the photoelectric conversion layer 4 performs photoelectric conversion (power generation) by using the incident light L and the reflection light R, that is, converts light energy into electrical energy.

In the solar cell 10 according to the embodiment, in the case where the photoelectric conversion layer 4 is formed by containing amorphous silicon, the optical absorption layer 3 is provided between the photoelectric conversion layer 4 and the reflection electrode layer 2. Therefore, the external color can be adjusted so that redness is suppressed for the following reasons.

Figure 2:
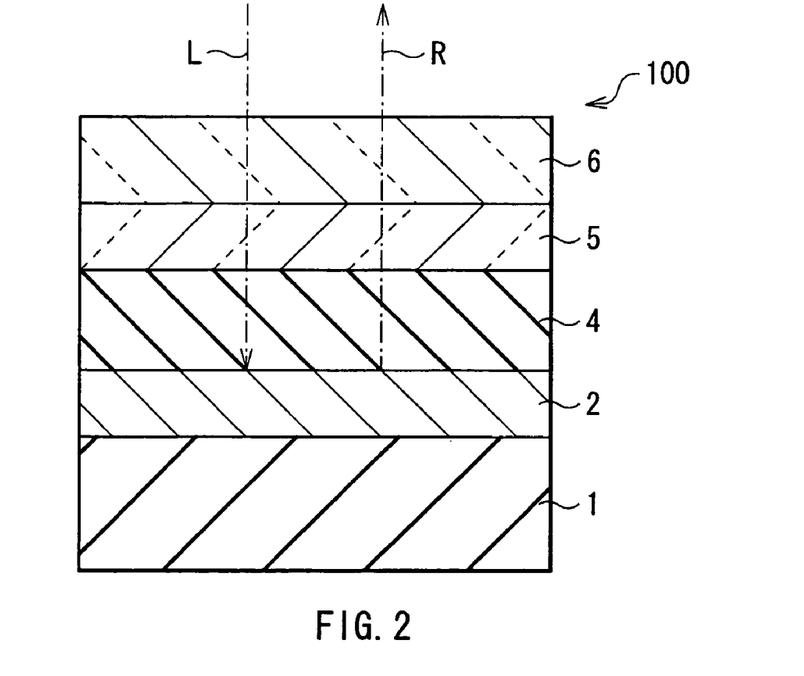
FIG. 2 is a cross section showing a sectional configuration of a solar cell as a comparative example of the solar cell according to the embodiment of the invention.

FIG. 2 shows the configuration of a solar cell 100 as a comparative example for the solar cell 10 of the embodiment and corresponds to the sectional configuration shown in FIG. 1. In the solar cell 100 as the comparative example, in the case where the photoelectric conversion layer 4 is formed by containing amorphous silicon, the optical absorption layer 3 is not provided between the photoelectric conversion layer 4 and the reflecting electrode layer 2. That is, the solar cell 100 has a configuration similar to that of the solar cell 10 according to the embodiment (refer to FIG. 1) except the point that the photoelectric conversion layer 4 is adjacent to the reflecting electrode layer 2.

In the solar cell 100 of the comparative example (refer to FIG. 2), the incident light L passed through the photoelectric conversion layer 4 is reflected as it is by the reflecting electrode layer 2. Specifically, remaining light of the incident light L, which is absorbed by the photoelectric conversion layer 4 is reflected by the reflecting electrode layer 2, so that redness of the reflection light R is emphasized. More concretely, when the incident light L reaches the reflecting electrode layer 2 via the photoelectric conversion layer 4, as described above, light components in the short and medium wavelength range are selectively and intensively absorbed by the photoelectric conversion layer 4 due to the light absorbing property of amorphous silicon in the photoelectric conversion layer 4. In this case, the proportion of light components in the long wavelength range is relatively large in the light finally reaching the reflecting electrode layer 2. Consequently, the color tone of the reflection light R is determined by reflecting the color tone of the light components in the long wavelength range whose proportion is relatively large. As a result of this, the color tone of the reflection light R is determined so as to reproduce redness caused by the light absorbing property of amorphous silicon as it is, so that the reflection light R takes on intense redness. When the reflection light R takes on the intense redness, naturally, the tone of the external color of the solar cell 100 determined on the basis of the color tone of the reflection light R take on the intense redness. It is therefore difficult to adjust the color tone of the external color of the solar cell 100 so as to suppress redness. For information, when the reflection light R is led to the outside of the solar cell 100 via the photoelectric conversion 4 as described above, a part of the reflection light R is absorbed by the photoelectric conversion layer 4. However, an absorption amount of the reflection light R by the photoelectric conversion layer 4 (an absorption amount of light in the long wavelength range) is markedly smaller than that of the incident light L (the absorption amount of light in the short and medium wavelength range). Therefore, the reflection light R passed through the photoelectric conversion layer 4 takes on the intense redness.

On the other hand, in the solar cell 10 according to the embodiment (refer to FIG. 1), the incident light L passed through the photoelectric conversion layer 4 further passes through the optical absorption layer 3 and, after that, is reflected by the reflecting electrode layer 2. That is, remaining light of the incident light L absorbed by the photoelectric conversion layer 4 and the optical absorption layer 3 is reflected by the reflecting electrode layer 2. Consequently, in comparison with the solar cell 100 of the comparative example, redness of the reflection light R can be suppressed. More concretely, when the incident light L passes through the photoelectric conversion layer 4 and the optical absorbing layer 3 in order and reaches the reflecting electrode layer 2, as described above, light components in the short and medium wavelength range are selectively and intensively absorbed by the photoelectric conversion layer 4 due to the light absorbing property of amorphous silicon forming the photoelectric layer 4. The remaining light components in the long wavelength range are absorbed by the optical absorption layer 3 on the basis of the light absorbing property of the optical absorption layer 3. In this case, the proportion of light components in the long wavelength range is relatively small in the light finally reaching the reflecting electrode layer 2, so that the color tone of the reflection light R is determined by reflecting the color tone of light components in the long wavelength range whose proportion is relatively small. As a result, redness caused by the light absorbing property of amorphous silicon is not reproduced as it is, that is, the color tone of the reflection light R is corrected so as to soften redness, so that redness of the reflection light R can be suppressed. Therefore, redness is suppressed also in the tone of the external color of the solar cell 10, which is determined on the basis of the color tone of the reflection light R. Thus, the external color of the solar cell 10 can be adjusted so as to suppress redness.

In particular, in the embodiment, the product $\alpha T$ of the absorption coefficient $\alpha$ and the thickness T of the optical absorption layer 3 is set to be in the range from 0.2 to 3.0 ($0.2 \leq \alpha T \leq 3.0$), so that the product $\alpha T$ is optimized from the viewpoint of sufficiently absorbing light passed through the photoelectric conversion layer 4 by the optical absorption layer 3. In this case, the optical absorption amount in the optical absorption layer 3 is sufficiently large, so that the intensity (light amount) of the reflection light R taking on redness is sufficiently small. Therefore, the color tone (redness) of the reflection light R largely shifts from the color tone (redness) resulting from the light absorbing property of amorphous silicon on chromaticity characteristics. Accordingly, the external color of the solar cell 10 can be adjusted so that redness is sufficiently suppressed.

In the case, further, as is evident from that the light absorbing property of the optical absorption layer 3 are determined on the basis of the product $\alpha T$, the optical absorption amount increases or decreases depending on the thickness T of the optical absorption layer 3, and the adjustment amount of the external color (shift amount of chromaticity on a chromaticity diagram) increases or decreases depending on the optical absorption amount of the optical absorption layer 3. Therefore, by changing the thickness T of the optical absorption layer 3, the tone of the external color can be changed. Accordingly, the tone of the external color can be controlled so as to be desired color tone.

In the embodiment, as described above, by using the light absorbing property of the optical absorption layer 3 provided between the photoelectric conversion layer 4 and the reflecting electrode layer 2, the external color of the solar cell 10 is adjusted. Consequently, the external color can be properly and stably adjusted and battery properties can be assured for the following reasons.

Specifically, as a method of adjusting external color of the solar cell 10, other than the method of using the optical absorption layer 3 described above, a method of using not the optical absorption layer 3 but the transparent electrode layer 5 can be also considered. In the method of using the transparent electrode layer 5, by changing the color tone of the reflection light R by using a light interference phenomenon which depends on the thickness of the transparent electrode layer 5, the external color can be adjusted. However, in this case, a change direction of the color tone of the reflection light R (a shift direction of the chromaticity on the chromaticity diagram) corresponding to a change in the thickness of the transparent electrode layer 5 does not corresponded to a redness intensity direction. That is, redness of the reflection light R does not largely change even if the thickness of the transparent electrode layer 5 is changed. It is therefore difficult to adequately adjust the external color so as to become desired color tone in which redness is suppressed. Although the change direction of the color tone of the reflection light R corresponding to the change in thickness of the transparent electrode layer 5 does not correspond to the redness intensity direction as described above, when the thickness of the transparent electrode layer 5 changes, the tone of the reflection light R changes not a little. Accordingly, when the thickness varies at the time of forming the transparent electrode layer 5, the color tone of the reflection light R also varies due to variation in the thickness of the transparent electrode layer 5. It is therefore difficult to stably adjust the external color so as to be desired color tone in which redness is suppressed. Moreover, in this case, in manufacture of the solar cell 10, if a situation occurs such that the color tone of the external color shifts from the desired color tone already at the time point the photoelectric conversion layer 4 is formed on the substrate 1, it is difficult to correct the tone of the external color to the desired color tone only by adjusting the thickness of the transparent electrode layer 5.

As a method of adjusting the external color of the solar cell 10, further, a method of using not the optical absorption layer 3 but the photoelectric conversion layer 4 can be also considered. In the method of using the photoelectric conversion layer 4, by changing the color tone of the reflection light R by using an optical absorption phenomenon which depends on the thickness of the photoelectric conversion layer 4, the external color can be adjusted. However, in this case, the thickness of the photoelectric conversion layer 4 has to be excessively increased in order to control the color tone of the reflection light R so as to sufficiently suppress redness. Specifically, the thickness of the photoelectric conversion layer 4 has to be set so as to exceed a proper thickness range contributing to the battery properties such as power generation performance and durability (for example, photodegradation resistance). It is therefore difficult to assure the battery properties while adjusting the color tone of the external color so as to suppress redness.

On the other hand, in the method of using the optical absorption layer 3, different from the method of using the transparent electrode layer 5, a change direction of the color tone of the reflection light R corresponding to the thickness change of the optical absorption layer 3 corresponds to the redness intensity direction, that is, by changing the thickness of the optical absorption layer 3, redness of the reflection light R is largely changed. Consequently, it is possible to accurately adjust the external color so as to have the desired color tone in which redness is suppressed. Even if the color tone of the reflection light R varies due to variation in the thickness of the transparent electrode layer 5, the color tone variation is cancelled out by using a sufficient color tone suppressing effect (redness suppressing effect) of the optical absorption layer 3. Consequently, it is possible to stably adjust the external color so as to be in the desired color tone in which redness is suppressed. Therefore, the external color can be properly and stably adjusted.

In the method of using the optical absorption layer 3, different from the method of using the photoelectric conversion layer 4, the tone of the external color can be controlled irrespective of the thickness of the photoelectric conversion layer 4. Consequently, while the thickness of the photoelectric conversion layer 4 is set so as to be in a proper thickness range contributing to the battery properties such as power generation performance or durability, the external color can be adjusted. Therefore, the battery properties can be assured.

In the embodiment, when nickel is selected as a material of the optical absorption layer 3 from the group of metals, the optical absorption layer 3 is in satisfactory ohmic connection to the photoelectric conversion layer 4 on the basis of electrical compatibility between amorphous silicon of the photoelectric conversion layer 4 and nickel. Accordingly, in comparison with the case of selecting a material other than nickel as a material of the optical absorption layer 3, the electrical characteristics of the solar cell 10 can be improved.

In addition, in the method of adjusting the color of the solar cell according to the embodiment, when the photoelectric conversion layer 4 is formed by containing amorphous silicon, by providing the optical absorption layer 3 between the photoelectric conversion layer 4 and the reflecting electrode layer 2, light passed through the photoelectric conversion layer 4 is absorbed by the optical absorption layer 3. Consequently, as described above, redness of the reflection light R contributing to the external color of the solar cell 10 can be suppressed. Therefore, the external color of the solar cell 10 can be adjusted so as to suppress redness.

Next, examples of the present invention will be described.

Example 1

By performing the following procedures, a solar cell described in the foregoing embodiment was manufactured. First, a PEN film was prepared as a substrate. After that, a film of aluminum was formed on the substrate by using DC sputtering, thereby forming a reflecting electrode layer so as to have 300 nm thickness. Subsequently, by forming a film of metal on the reflecting electrode layer by using the DC sputtering, an optical absorption layer was formed. By forming a film of amorphous silicon (nip junction film) on the optical absorption layer by using plasma chemical vaper deposition, a photoelectric conversion layer was formed so as to have 650 nm thickness. Subsequently, a film of ITO was formed on the photoelectric conversion layer by using sputtering, thereby forming a transparent electrode layer. At this time, the photoelectric conversion layer, the reflecting electrode layer and the transparent electrode layer were integrated to enable power to be generated in the photoelectric conversion layer. Finally, by printing an epoxy resin by using screen printing on the transparent electrode layer, the sealing member was formed. As a result, a solar cell was completed.

Example 2

A solar cell was manufactured by performing procedures similar to those of the example 1 except for the point that an optical absorption layer was formed by using silicide in place of metal.

Example 3

A solar cell was manufactured by performing procedures similar to those of the example 1 except for the point that an optical absorption layer was formed by using stainless steel (SUS) in place of metal.

Comparative Example

A solar cell was manufactured by performing procedures similar to those of the example 1 except for the point that an optical absorption layer was not formed between a photoelectric conversion layer and a reflecting electrode layer.

Characteristics were examined with respect to the solar cells of the examples 1 to 3. At the time of examining characteristics of the solar cells of the examples 1 to 3, to evaluate the characteristics by comparison, characteristics of the solar cell of the comparative example were also examined as necessary.

First, characteristics of the solar cell of the example 1 in which metal was used as the material of the optical absorption layer were examined, and the following series of results were obtained.

Figure 3:
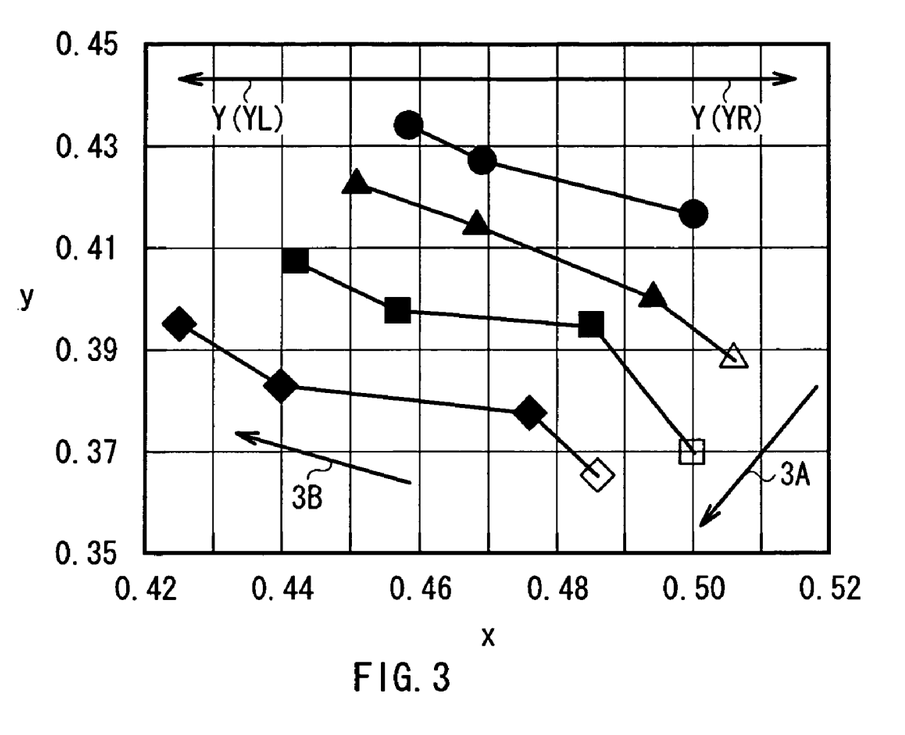
FIG. 3 is a diagram showing chromaticity characteristics of a solar cell of Example 1.

First, the influence of the thickness of the transparent electrode layer and the thickness of the optical absorption layer exerted on the external color of the solar cell was examined with respect to the case where nickel was used as a material of the optical absorption layer, and results shown in FIG. 3 were obtained. FIG. 3 shows chromaticity characteristics (so-called chromaticity diagram) of the solar cell of the example 1. "Horizontal axis" denotes chromaticity x and "vertical axis" denotes chromaticity y. The chromaticity shown in FIG. 3 is chromaticity of the reflection light which is led to the outside of the solar cell via the sealing member and is a result of measurement with a U-4000 self-registering spectrophotometer made by Hitachi, Ltd. The definition of the chromaticity and the measurement method are similarly employed also in FIGS. 5 and 7 which will be described later. To examine the influence, the thickness of the optical absorption layer was changed in three levels of 2 nm, 9 nm and 44 nm, and the thickness of the transparent electrode layer was changed in four levels of 50 nm, 60 nm, 64 nm, and 70 nm, that is, total twelve kinds of solar cells were manufactured. A series of symbols shown in FIG. 3 denote the twelve kinds of solar cells. Specifically, the thickness of the optical absorption layer and the thickness of the transparent electrode layer of "solid circle (right)" are 2 nm and 50 nm, respectively, those of "solid circle (center)" are 9 nm and 50 nm, those of "solid circle (left)" are 44 nm and 50 nm, those of "solid triangle (right)" are 2 nm and 60 nm, those of "solid triangle (center)" are 9 nm and 60 nm, those of "solid triangle (left)" are 44 nm and 60 nm, those of "solid square (right)" are 2 nm and 64 nm, those of "solid square (center)" are 9 nm and 64 nm, those of "solid square (left)" are 44 nm and 64 nm, those of "solid diamond (right)" are 2 nm and 70 nm, those of "solid diamond (center)" are 9 nm and 70 nm, and those of "solid diamond (left)" are 44 nm and 70 nm. In FIG. 3, to evaluate the chromaticity characteristics of the solar cell of the example 1 by comparison, chromaticity characteristics of the solar cell of the comparative example are also shown. The thickness of the transparent electrode layer in the solar cell of the comparative example of blank triangle is 60 nm, that of blank square is 64 nm, and that of blank diamond is 70 nm. In FIG. 3, to make the color tone change direction which will be described below easily understood, the redness intensity direction Y in the chromaticity characteristics is shown. More concretely, a direction in which redness becomes stronger is shown as a right direction YR and, on the other hand, a direction in which redness becomes weaker is shown as a left direction YL.

As understood from the results shown in FIG. 3, in the solar cell of the example 1, also in the case where the thickness of the optical absorption layer was set to be any of 2 nm (solid circle, triangle, square, and diamond (right)), 9 nm (solid circle, triangle, square, and diamond (center)), and 44 nm (solid circle, triangle, square, and diamond (left)), by increasing the thickness of the transparent electrode layer in order as 50 nm, 60 nm, 64 nm, and 70 nm (solid circle→solid triangle→solid square→solid diamond), the chromaticity largely shifted in a downward direction 3A. It means that, when the thickness of the transparent electrode layer is increased, although the chromaticity of the reflection light changes, since the chromaticity change direction at this time (the downward direction 3A) does not correspond to the intensity direction Y of redness, redness of the reflection light cannot be sufficiently suppressed. On the other hand, in the solar cell of the example 1, also in the case where the thickness of the transparent electrode layer was set to be any of 50 nm (solid circle), 60 nm (solid triangle), 64 nm (solid square), and 70 nm (solid diamond), by increasing the thickness of the optical absorption layer in order as 2 nm, 9 nm, and 44 nm (solid circle, triangle, square, and diamond (right→center→left)), the chromaticity largely shifted in a left direction 3B. It means that, by increasing the thickness of the optical absorption layer, the chromaticity of the reflection light changes. Moreover, since the chromaticity change direction (the left direction 3B) at this time corresponds to the redness intensity direction Y, more concretely, the left direction YL in which redness becomes weaker, redness of the reflection light can be sufficiently suppressed. When chromaticity is compared between the solar cell of the example 1 (solid triangle, square, and diamond) and the solar cell of the comparative example (blank triangle, square, and diamond), the chromaticity of the solar cell of the example 1 shifts to the left direction 3B in the solar cell of the example 1 larger than in the solar cell of the comparative example. This means that, by providing the optical absorption layer between the photoelectric conversion layer and the reflecting electrode layer, redness of the reflection light can be sufficiently suppressed on the basis of the existence of the optical absorption layer. As a result, it was confirmed that, in the solar cell of the invention (the example 1), by providing the optical absorption layer (metal) between the photoelectric conversion layer and the reflecting electrode layer, the color tone of the reflection light can be adjusted so that redness is sufficiently suppressed. It was also confirmed that, to adjust the color tone of the reflection light so as to sufficiently suppress redness, the method of using the optical absorption layer (metal) is more effective than the method of using the transparent electrode layer.

Although it will not be described with concrete data, the influence of the thickness of the transparent electrode layer and the thickness of the optical absorption layer exerted on the external color of the solar cell was examined with respect to not only the solar cell using nickel as the material of the optical absorption layer but also solar cells using a series of metals (the series of metals other than nickel) listed in Table 1 which will be described later. Results similar to those obtained from the solar cell using nickel were obtained from the other solar cells using the series of metals.

Figure 4:
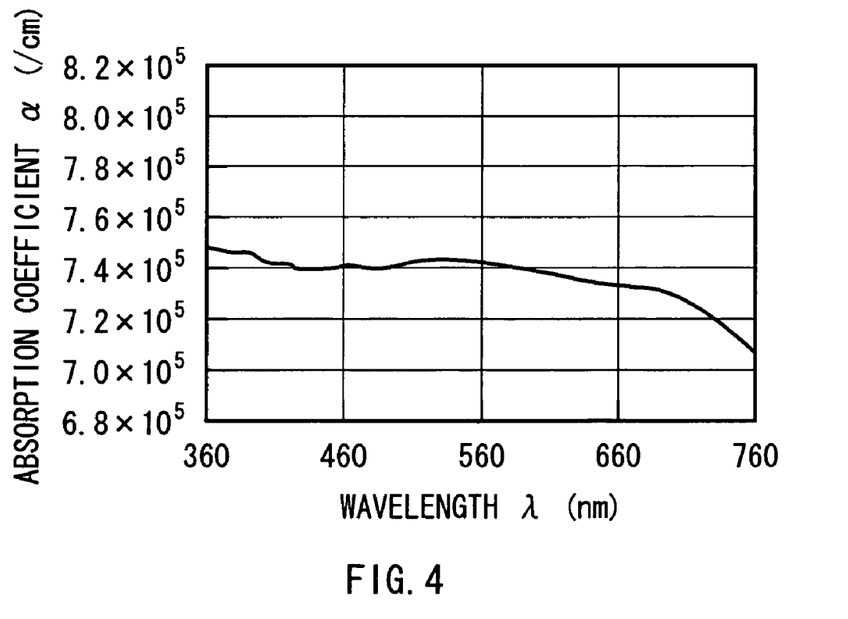
FIG. 4 is a diagram showing the light absorbing property of an optical absorption layer in the solar cell of Example 1.

Second, the light absorbing property of nickel used as the material of the optical absorption layer were examined for confirmation, and results shown in FIG. 4 were obtained. FIG. 4 shows the light absorbing property of the optical absorption layer in the solar cell of the example 1. "Horizontal axis" denotes wavelength λ (nm) and "vertical axis" denotes the absorption coefficient α (/cm). FIG. 4 shows the absorption coefficient α at the wavelength λ of 750 nm. A reference wavelength (wavelength=750 nm) for specifying the absorption coefficient α will be the same in FIGS. 6 and 8 which will be described later.

As understood from the results shown in FIG. 4, the absorption coefficient α is almost constant over the range of the wavelength λ from 360 nm to 760 nm in the optical absorption layer formed by using nickel. This indicates that the optical absorption layer has the light absorbing property that it can absorb light in the whole short/medium wavelength range. As a result, it was confirmed that, in the solar cell of the invention (the example 1), the optical absorption layer (metal) can absorb light in the long wavelength range on the basis of the light absorbing property over the wide wavelength range described above.

Third, the correlation between material of the optical absorption layer and light absorbing property was examined, and results shown in Table 1 were obtained. Table 1 shows the correlation between the material of the optical absorption layer and the light absorbing property. As "material", a series of metals are shown. As factors contributing to the light absorbing property of the optical absorption layer, "absorption coefficient α (/cm)" and "thickness T (nm)" are shown. In Table 1, to represent the materials (metals) of the optical absorption layer, nickel (Ni), aluminium (Al), copper (Cu), gold, (Au), manganese (Mn), niobium (Nb), palladium (Pd), platinum (Pt), silver (Ag) and zinc (Zn) are listed. At the time of examining the correlation, the thickness T satisfying a proper range ($0.2 \leq \alpha T \leq 3.0$) of the product αT which can adjust the color tone of the reflection light so as to sufficiently suppress redness was calculated in consideration of the absorption coefficients α of the series of metals. "Thickness T" in Table 1 shows the range satisfying the proper range of the product αT (from the lower limit to the upper limit). The definition of the "thickness T" is the same in Tables 2 and 3 which will be described later.

TABLE 1

| Material | Absorption coefficient α (/cm) | Thickness T (nm) |
|---|---|---|
| Ni | $7.04 \times 10^5$ | 2–44 |
| Al | $1.44 \times 10^6$ | 1–22 |
| Cu | $7.25 \times 10^5$ | 2–43 |
| Au | $7.27 \times 10^5$ | 2–43 |
| Mn | $6.53 \times 10^5$ | 3–47 |
| Nb | $5.23 \times 10^5$ | 3–59 |
| Pd | $8.09 \times 10^5$ | 2–38 |
| Pt | $7.92 \times 10^5$ | 2–39 |
| Ag | $8.69 \times 10^5$ | 2–56 |
| Zn | $7.75 \times 10^5$ | 2–40 |

As shown in Table 1, when the series of metals are used as materials of the optical absorption layer, the proper range of the thickness T of the optical absorption layer is specified for each of the metals. Therefore, by setting the thickness T of the optical absorption layer for each of the metals so as to be in the proper range shown in Table 1, the color tone of the reflection light can be adjusted so as to sufficiently suppress redness.

Next, the characteristics of the solar cell of the example 2 in which silicide is used as the material of the optical absorption layer were examined, and the following series of results were obtained.

Figure 5:
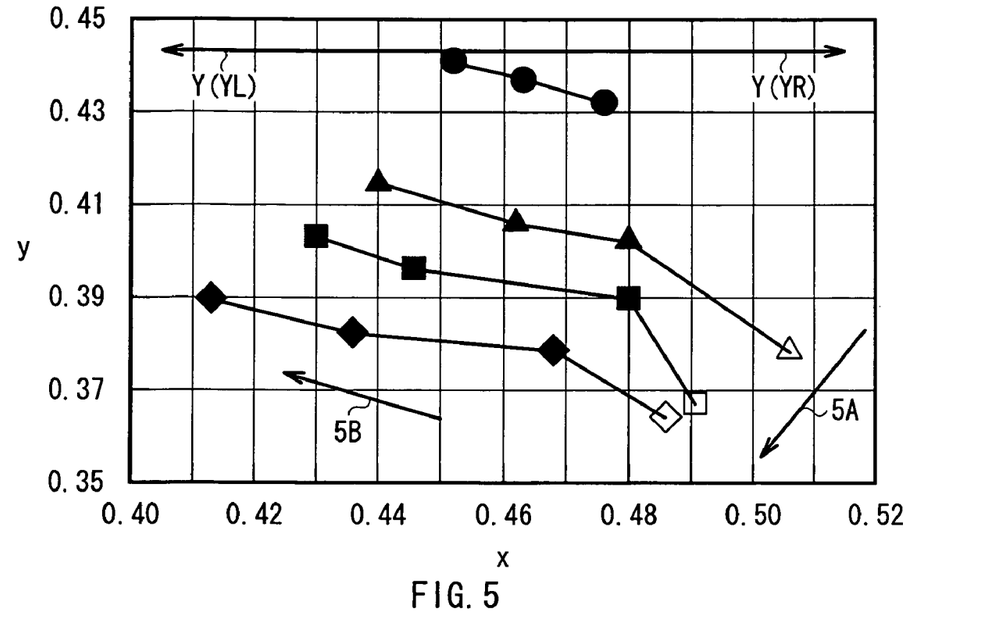
FIG. 5 is a diagram showing chromaticity characteristics of a solar cell of Example 2.

First, the influence of the thickness of the transparent electrode layer and the thickness of the optical absorption layer exerted on the external color of the solar cell was examined with respect to the case where palladium silicide ($Pd_2Si$) was used as the material of the optical absorption layer, and results shown in FIG. 5 were obtained. FIG. 5 shows chromaticity characteristics of the solar cell of the example 2 and corresponds to the chromaticity characteristics shown in FIG. 3. To examine the influence, the thickness of the optical absorption layer was changed in three levels of 6 nm, 12 nm and 25 nm, and the thickness of the transparent electrode layer was changed in four levels of 40 nm, 62 nm, 67 nm, and 70 nm, that is, total twelve kinds of solar cells were manufactured. A series of symbols shown in FIG. 5 denote the twelve kinds of solar cells. Specifically, the thickness of the optical absorption layer and the thickness of the transparent electrode layer of "solid circle (right)" are 6 nm and 40 nm, respectively, those of "solid circle (center)" are 12 nm and 40 nm, those of "solid circle (left)" are 25 nm and 40 nm, those of "solid triangle (right)" are 6 nm and 62 nm, those of "solid triangle (center)" are 12 nm and 62 nm, those of "solid triangle (left)" are 25 nm and 62 nm, those of "solid square (right)" are 6 nm and 67 nm, those of "solid square (center)" are 12 nm and 67 nm, those of "solid square (left)" are 25 nm and 67 nm, those of "solid diamond (right)" are 6 nm and 70 nm, those of "solid diamond (center)" are 12 nm and 70 nm, and those of "solid diamond (left)" are 25 nm and 70 nm. In FIG. 5, to evaluate the chromaticity characteristics of the solar cell of the example 2 by comparison, chromaticity characteristics of the solar cell of the comparative example are also shown. The thickness of the transparent electrode layer in the solar cell of the comparative example of blank triangle is 62 nm, that of blank square is 67 nm, and that of blank diamond is 70 nm.

As understood from the results shown in FIG. 5, in the solar cell of the example 2, also in the case where the thickness of the optical absorption layer was set to be any of 6 nm (solid circle, solid triangle, solid square, and solid diamond (right)), 12 nm (solid circle, solid triangle, solid square, and solid diamond (center)), and 25 nm (solid circle, solid triangle, solid square, and solid diamond (left)), by increasing the thickness of the transparent electrode layer in order as 40 nm, 62 nm, 67 nm, and 70 nm (solid circle→solid triangle→solid square→solid diamond), the chromaticity largely shifted in a downward direction 5A. On the other hand, in the solar cell of the example 2, also in the case where the thickness of the transparent electrode layer was set to be any of 40 nm (solid circle), 62 nm (solid triangle), 67 nm (solid square), and 70 nm (solid diamond), by increasing the thickness of the optical absorption layer in order as 6 nm, 12 nm, and 25 nm (solid circle, solid triangle, solid square, and solid diamond (right→center→left)), the chromaticity largely shifted in a left direction 5B. In this case as well, results similar to those of the case described with reference to FIG. 3 were obtained as the influence of the thickness of the optical absorption layer and the thickness of the transparent electrode layer exerted on the chromaticity. When chromaticity was compared between the solar cell of the example 2 (solid triangle, solid square, and solid diamond) and the solar cell of the comparative example (blank triangle, blank square, and blank diamond), the chromaticity of the solar cell of the example 2 shifted to the left direction 5B larger than in the solar cell of the comparative example. That is, in this case as well, as the effects of providing the optical absorption layer, results similar to those in the case described with reference to FIG. 3 were obtained. It was consequently confirmed that, in the solar cell of the invention (the example 2), by providing the optical absorption layer (silicide) between the photoelectric conversion layer and the reflecting electrode layer, the color tone of the reflection light can be adjusted so that redness is sufficiently suppressed and the method using the optical absorption layer (silicide) in order to adjust the color tone of the reflection light so as to sufficiently suppress redness is effective.

Although it will not be described with concrete data, the influence of the thickness of the transparent electrode layer and the thickness of the optical absorption layer exerted on the external color of the solar cell was examined with respect to not only the solar cell using palladium silicide as the material of the optical absorption layer but also solar cells using a series of silicides (a series of silicides other than palladium silicide) listed in Table 2 which will be described later. Results similar to those obtained from the solar cell using palladium silicide were obtained from the other solar cells using the series of silicides.

Figure 6:
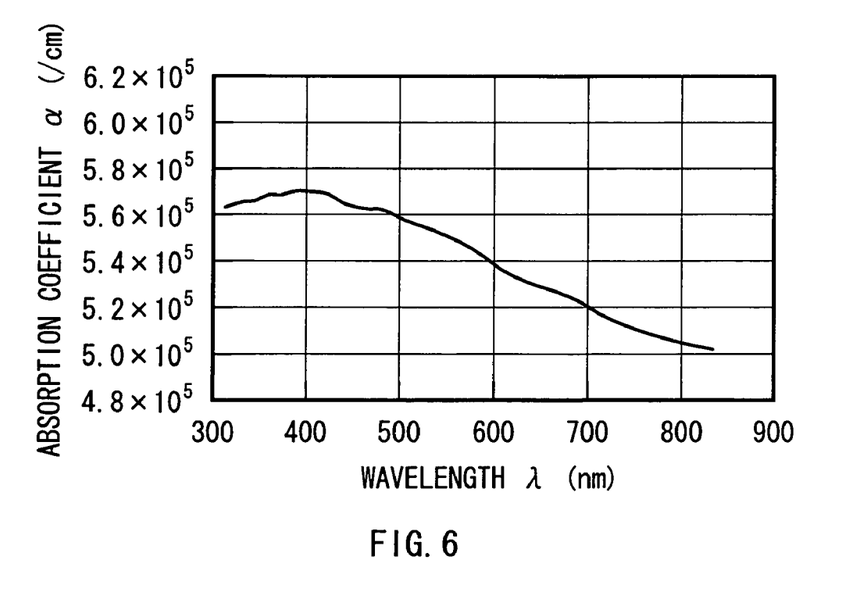
FIG. 6 is a diagram showing the light absorbing property of an optical absorption layer in the solar cell of Example 2.

Second, the light absorbing property of palladium silicide used as the material of the optical absorption layer were examined for confirmation, and results shown in FIG. 6 were obtained. FIG. 6 shows the light absorbing property of the optical absorption layer in the solar cell of the example 2 and corresponds to the light absorbing property shown in FIG. 4.

As understood from the results shown in FIG. 6, the absorption coefficient α is almost constant over the range of the wavelength λ from 300 nm to 830 nm in the optical absorption layer formed by using palladium silicide. That is, as the light absorbing property of the optical absorption layer, results similar to those in the case described with reference to FIG. 4 were obtained. It was therefore confirmed that, in the solar cell of the invention (the example 2), the optical absorption layer (silicide) can absorb light in the long wavelength range.

Third, the correlation between the material of the optical absorption layer and the light absorbing property was examined, and results shown in Table 2 were obtained. Table 2 shows the correlation between the material of the optical absorption layer and the light absorbing property and corresponds to Table 1. In Table 2, as representatives of the material (silicide) of the optical absorption layer, chromium silicide ($CrSi$ or $CrSi_2$), cobalt silicide ($CoSi$, $Co_2Si$, or $CoSi_2$), iron silicide ($FeSi$ or $FeSi_2$), manganese silicide ($MnSi$), molybdenum silicide ($Mo_2Si$), niobium silicide ($NbSi_2$), palladium silicide ($Pd_2Si$), platinum silicide ($PtSi$ or $Pt_2Si$), tantalum silicide ($TaSi_2$), titanium silicide ($TiSi$ or $TiSi_2$), tungsten silicide ($WSi_2$) and nickel silicide ($NiSi$, $Ni_2Si$ or $NiSi_2$) are listed. Table 2 shows only representative chemical formulas ($CrSi$, $CoSi$, $FeSi$, $MnSi$, $MoSi$, $NbSi$, $PdSi$, $PtSi$, $TaSi$, $TiSi$, $WSi$, and $NiSi$) as the series of silicides.

TABLE 2

| Material | Absorption coefficient α (/cm) | Thickness T (nm) |
| --- | --- | --- |
| CrSi | $3.63 \times 10^5$ | 5–83 |
| CoSi | $3.80 \times 10^5$ | 5–79 |
| FeSi | $3.39 \times 10^5$ | 6–88 |
| MnSi | $4.68 \times 10^5$ | 4–64 |
| MoSi | $4.37 \times 10^5$ | 5–69 |
| NbSi | $4.90 \times 10^5$ | 4–61 |
| PbSi | $5.13 \times 10^5$ | 4–59 |
| PtSi | $4.57 \times 10^5$ | 4–66 |
| TaSi | $3.80 \times 10^5$ | 5–79 |
| TiSi | $6.31 \times 10^5$ | 3–48 |
| WSi | $3.31 \times 10^5$ | 6–90 |
| NiSi | $3.80 \times 10^5$ | 5–79 |

As shown in Table 2, in the case of using the series of silicides as the material of the optical absorption layer, a proper range of the thickness T of the optical absorption layer is specified for each of the suicides. Therefore, by setting the thickness T of the optical absorption layer for each of the silicides so as to be in the proper range shown in Table 2, the color tone of the reflection light can be adjusted so as to sufficiently suppress redness.

Finally, characteristics of the solar cell of the example 3 using stainless steel (SUS) as the material of the optical absorption layer were examined, and the following series of results were obtained.

Figure 7:
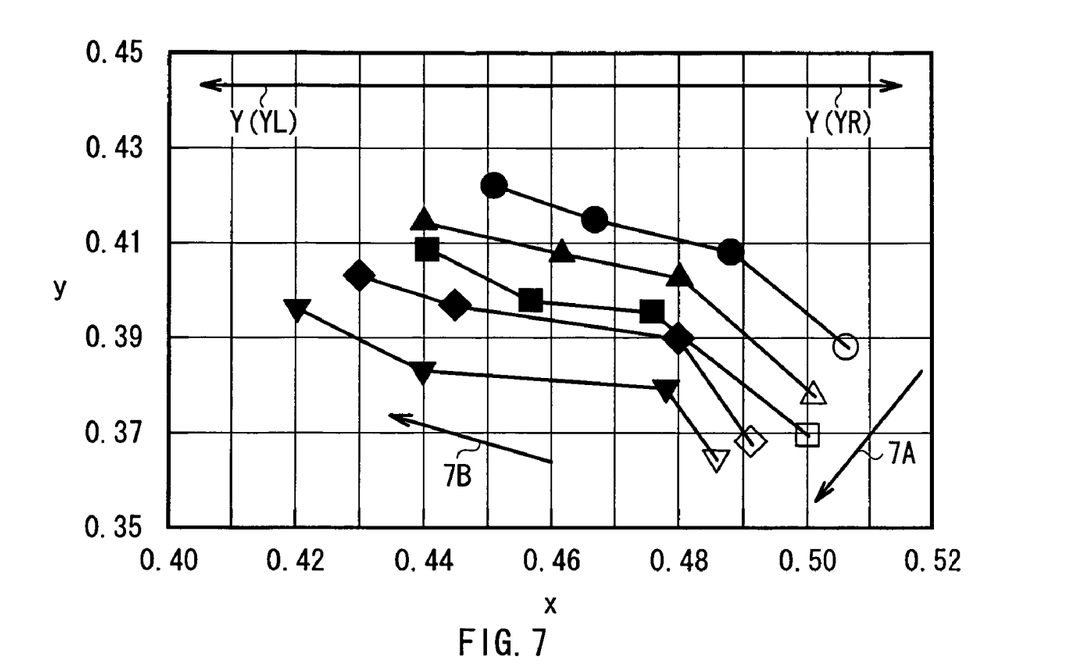
FIG. 7 is diagram showing chromaticity characteristics of a solar cell of Example 3.

First, the influence of the thickness of the transparent electrode layer and the thickness of the optical absorption layer exerted on the external color of the solar cell was examined with respect to the case where SUS304 was used as the material of the optical absorption layer, and results shown in FIG. 7 were obtained. FIG. 7 shows chromaticity characteristics of the solar cell of the example 3 and corresponds to the chromaticity characteristics shown in FIG. 3. To examine the influence, the thickness of the optical absorption layer was changed in three levels of 5 nm, 10 nm and 20 nm, and the thickness of the transparent electrode layer was changed in five levels of 60 nm, 62 nm, 64 nm, 67 nm, and 70 nm, that is, total fifteen kinds of solar cells were manufactured. A series of symbols shown in FIG. 10 denote the fifteen kinds of solar cells. Specifically, the thickness of the optical absorption layer and the thickness of the transparent electrode layer of "solid circle (right)" are 5 nm and 60 nm, respectively, those of "solid circle (center)" are 10 nm and 60 nm, those of "solid circle (left)" are 20 nm and 60 nm, those of "solid triangle (right)" are 5 nm and 62 nm, those of "solid triangle (center)" are 10 nm and 62 nm, those of "solid triangle (left)" are 20 nm and 62 nm, those of "solid square (right)" are 5 nm and 64 nm, those of "solid square (center)" are 10 nm and 64 nm, those of "solid square (left)" are 20 nm and 64 nm, those of "solid diamond (right)" are 5 nm and 67 nm, those of "solid diamond (center)" are 10 nm and 67 nm, those of "solid diamond (left)" are 20 nm and 67 nm, those of "downward solid triangle (right)" are 5 nm and 70 nm, those of "downward solid triangle (center)" are 10 nm and 70 nm, and those of "downward solid triangle (left)" are 20 nm and 70 nm. In FIG. 7, to evaluate the chromaticity characteristics of the solar cell of the example 3 by comparison, chromaticity characteristics of the solar cell of the comparative example are also shown. The thickness of the transparent electrode layer in the solar cell of the comparative example of blank circle is 60 nm, that of "blank upward triangle" is 62 nm, that of "blank square" is 64 nm, that of "blank diamond" is 67 nm, and that of "blank downward triangle" is 70 nm.

As understood from the results shown in FIG. 7, also in the case where the thickness of the optical absorption layer was set to be any of 5 nm (solid circle, solid upward triangle, solid square, solid diamond, and solid downward triangle (right)), 10 nm (solid circle, solid upward triangle, solid square, solid diamond, and solid downward triangle (center)), and 20 nm (solid circle, solid upward triangle, solid square, solid diamond, and solid downward triangle (left)), by increasing the thickness of the transparent electrode layer in order as 60 nm, 62 nm, 64 nm, 67 nm, and 70 nm (solid circle→solid upward triangle→solid square→solid diamond→solid downward triangle), the chromaticity largely shifted in a downward direction 7A. On the other hand, also in the case where the thickness of the transparent electrode layer was set to be any of 60 nm (solid circle), 62 nm (solid upward triangle), 64 nm (solid square), 67 nm (solid diamond), and 70 nm (solid downward triangle), by increasing the thickness of the optical absorption layer in order as 5 nm, 10 nm, and 20 nm (solid circle, solid upward triangle, solid square, solid diamond, and solid downward triangle (right→center→left)), the chromaticity largely shifted in a left direction 7B. In this case as well, tendency similar to that in the case described with reference to FIG. 3 were obtained with respect to the influence of the thickness of the optical absorption layer and the thickness of the transparent electrode layer exerted on the chromaticity. When chromaticity was compared between the solar cells of the example 3 (solid circle, solid upward triangle, solid square, solid diamond, and solid downward triangle) and the solar cells of the comparative example (blank circle, blank upward triangle, blank square, blank diamond, and blank downward triangle), the chromaticity of the solar cells of the example 3 shifted to the left direction 7B larger than in the solar cells of the comparative example. That is, in this case as well, as the effects of providing the optical absorption layer, results similar to those in the case described with reference to FIG. 3 were obtained. It was consequently confirmed that, in the solar cell of the invention (the example 3), by providing the optical absorption layer (stainless steel) between the photoelectric conversion layer and the reflecting electrode layer, the color tone of the reflection light can be adjusted so that redness is sufficiently suppressed and the method using the optical absorption layer (stainless steel) in order to adjust the color tone of the reflection light so as to sufficiently suppress redness is effective.

Figure 8:
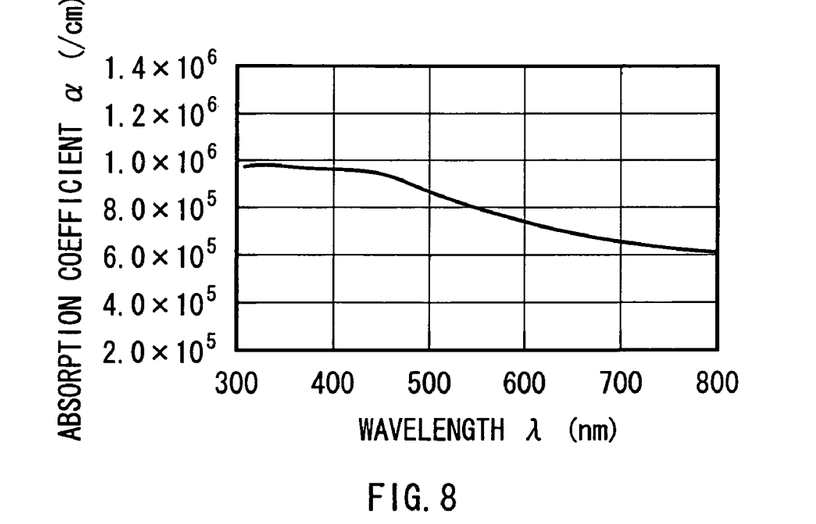
FIG. 8 is a diagram showing the optical absorbing property of the optical absorption layer in the solar cell of Example 3.

Second, the light absorbing property of SUS304 used as the material of the optical absorption layer was examined for confirmation, and results shown in FIG. 8 were obtained. FIG. 8 shows the light absorbing property of the optical absorption layer in the solar cell of the example 3 and corresponds to the light absorbing property shown in FIG. 4.

As understood from the results shown in FIG. 8, the absorption coefficient α is almost constant over the range of the wavelength λ from 300 nm to 800 nm in the optical absorption layer formed by using SUS304. That is, as the light absorbing property of the optical absorption layer, results similar to those in the case described with reference to FIG. 4 were obtained. It was therefore confirmed that, in the solar cell of the invention (the example 3), the optical absorption layer (stainless steel) can absorb light in the long wavelength range.

Figure 9:
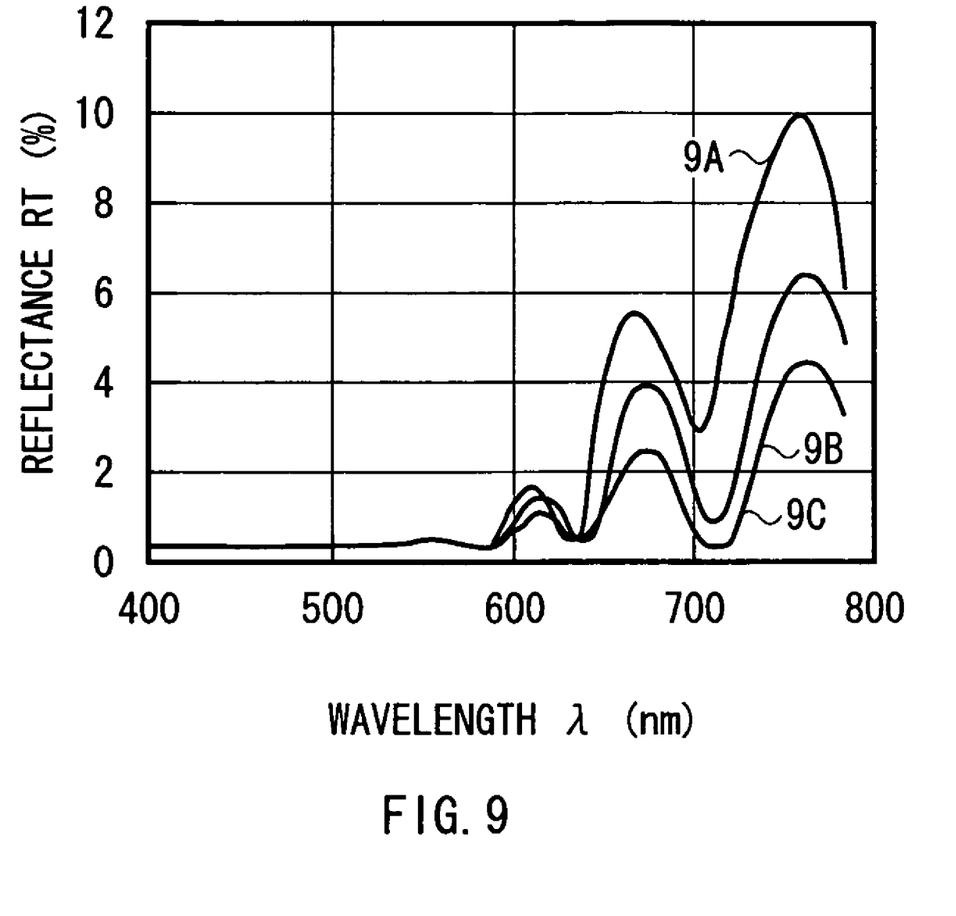
FIG. 9 is a diagram showing spectrum characteristics of reflection light in the solar cell of Example 3.

Third, for reference, reflectance characteristics of reflection light were examined with respect to the case where SUS304 is used as the material of the optical absorption layer, and results shown in FIG. 9 were obtained. FIG. 9 shows spectrum characteristics of the reflection light in the solar cell of the example 3. "Horizontal axis" denotes wavelength λ (nm) and "vertical axis" denotes reflectance RT (%). To examine the reflectance characteristics, while changing the thickness of the optical absorption layer in three levels of 5 nm, 10 nm, and 20 nm and fixing the thickness of the transparent electrode layer to 7 nm, three kinds of solar cells were manufactured. FIG. 9 shows conditions that the thickness of the optical absorption layer of "9A" is 5 nm, that of "9B" is 10 nm, and that of "9C" is 20 nm.

As understood from the results shown in FIG. 9, as spectrum characteristics of the reflection light, the reflectance RT selectively increases in the range of the wavelength λ of about 600 nm or more at which redness occurs and, particularly, spectral peaks are seen at the wavelengths λ of about 610 nm, 670 nm, and 750 nm. However, the reflectance RT, that is, the strength of the reflection light gradually decreases as the thickness of the optical absorption layer increases in order of 5 nm (9A), 10 nm (9B), and 20 nm (9C). It was therefore confirmed that, in the solar cell of the invention (the example 3), by increasing the thickness of the optical absorption layer (stainless steel), the action of suppressing redness of the reflection light can be increased.

Fourth, the correlation between the material of the optical absorption layer and light absorbing property was examined, and results shown in Table 3 were obtained. Table 3 shows the correlation between the material of the optical absorption layer and the light absorbing property and corresponds to the correlation shown in Table 1. Table 3 shows SUS304 as the material of the optical absorption layer (stainless steel).

TABLE 3

| Material | Absorption coefficient α (/cm) | Thickness T (nm) |
|---|---|---|
| SUS304 | $6.29 \times 10^5$ | 3–50 |

As shown in Table 3, when the stainless steel (SUS304) is used as the material of the optical absorption layer, a proper range of the thickness T of the optical absorption layer is specified. Therefore, by setting the thickness T of the optical absorption layer so as to be in the proper range shown in Table 3, the color tone of the reflection light can be adjusted so as to sufficiently suppress redness.

Although the invention has been described above by the embodiment and the examples, the invention is not limited to the foregoing embodiment and examples but can be variously modified. Concretely, for example, the series of metals, the series of silicides, and the stainless steel have been listed as materials of the optical absorption layer in the foregoing embodiment and examples. The material of the optical absorption is not always limited to any of the materials in the lists but can be freely set as long as the external color of the solar cell can be adjusted so as to suppress redness by using the light absorbing property of the optical absorption layer. More concretely, the material of the optical absorption layer may be, for example, a metal, a silicide, or a stainless steel of a kind other than the kinds listed above, or a material other than metals, silicides, or stainless steels.

The solar cell and the method of adjusting color of the same according to the invention can be applied to, for example, a solar cell for low-illumination-level use.

Obviously, many modifications and variations of the present invention are possible in the light of the above teachings. It is therefore to be understood that within the scope of the appended claims, the invention may be practiced otherwise than as specifically described.

What is claimed is:

1. A solar cell comprising:
   a first electrode layer having a light transmitting property;
   a second electrode layer having a light reflecting property;
   a photoelectric conversion layer provided between the first and second electrode layers, containing amorphous silicon, and converting light energy into electrical energy; and
   an optical absorption layer provided between the photoelectric conversion layer and the second electrode layer and having electrical conductivity and a light absorbing property, wherein
   the optical absorption layer is a single metal;
   a product αT between an absorption coefficient α and a thickness T of the optical absorption layer is in a range of 0.2 to 3.0; and
   the single metal of the optical absorption layer is a single metal selected from a group consisting of aluminum (Al), copper (Cu), gold, (Au), manganese (Mn), niobium (Nb), palladium (Pd), platinum (Pt), and zinc (Zn).

2. A solar cell according to claim 1, wherein the single metal of the optical absorption layer is different than metals included in the second electrode layer.

* * * * *

UNITED STATES PATENT AND TRADEMARK OFFICE
CERTIFICATE OF CORRECTION

| | | Page 1 of 1 |
|---|---|---|
| PATENT NO. | : 8,373,058 B2 | |
| APPLICATION NO. | : 11/362913 | |
| DATED | : February 12, 2013 | |
| INVENTOR(S) | : Morooka et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1456 days.

Signed and Sealed this
Second Day of December, 2014

Michelle K. Lee
*Deputy Director of the United States Patent and Trademark Office*